(12) United States Patent
Escobar et al.

(10) Patent No.: US 8,420,468 B2
(45) Date of Patent: Apr. 16, 2013

(54) STRAIN-COMPENSATED FIELD EFFECT TRANSISTOR AND ASSOCIATED METHOD OF FORMING THE TRANSISTOR

(75) Inventors: Alberto Escobar, Katy, TX (US); Brian J. Greene, Yorktown Heights, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 13/220,753

(22) Filed: Aug. 30, 2011

(65) Prior Publication Data

US 2011/0312143 A1    Dec. 22, 2011

Related U.S. Application Data

(62) Division of application No. 11/764,948, filed on Jun. 19, 2007, now Pat. No. 8,030,687.

(51) Int. Cl.
*H01L 21/336* (2006.01)

(52) U.S. Cl.
USPC .......................................... 438/167; 438/169

(58) Field of Classification Search .................. 438/167, 438/169; 257/194
See application file for complete search history.

(56) References Cited

U.S. PATENT DOCUMENTS

| | | | |
|---|---|---|---|
| 5,294,360 A * | 3/1994 | Carlson et al. | .................. 252/74 |
| 7,060,549 B1 | 6/2006 | Craig et al. | |
| 7,400,031 B2 | 7/2008 | Anderson et al. | |
| 2006/0237785 A1 | 10/2006 | Ieong et al. | |
| 2006/0249794 A1 | 11/2006 | Teh et al. | |
| 2006/0252194 A1 | 11/2006 | Lim et al. | |
| 2008/0265241 A1 * | 10/2008 | Foerster | .......................... 257/18 |
| 2010/0135937 A1 | 6/2010 | O'Brien et al. | |

OTHER PUBLICATIONS

Escobar et al., U.S. Appl. No. 11/764,948, Office Action Communication, Feb. 8, 2010, 8 pages.
Escobar et al., U.S. Appl. No. 11/764,948, Office Action Communication, Jul. 23, 2010, 8 pages.
Escobar et al., U.S. Appl. No. 11/764,948, Notice of Allowance, May 31, 2011, 4 pages.

* cited by examiner

*Primary Examiner* — Long Pham
*Assistant Examiner* — Steven Rao
(74) *Attorney, Agent, or Firm* — Gibb & Riley, LLC; Richard M. Kotulak, Esq.

(57) ABSTRACT

Disclosed are embodiments of a field effect transistor (FET) having decreased drive current temperature sensitivity. Specifically, any temperature-dependent carrier mobility change in the FET channel region is simultaneously counteracted by an opposite strain-dependent carrier mobility change to ensure that drive current remains approximately constant or at least within a predetermined range in response to temperature variations. This opposite strain-dependent carrier mobility change is provided by a straining structure that is configured to impart a temperature-dependent amount of a pre-selected strain type on the channel region. Also disclosed are embodiments of an associated method of forming the field effect transistor.

15 Claims, 7 Drawing Sheets

STRAIN-COMPENSATED FIELD EFFECT TRANSISTOR AND ASSOCIATED METHOD OF FORMING THE TRANSISTOR

CROSS-REFERENCE TO RELATED APPLICATIONS

This application is a Divisional of U.S. application Ser. No. 11/764,948 filed Jun. 19, 2007 U.S. Pat. No. 8,030,687, issued Oct. 4, 2011, the complete disclosure of which, in its entirety, is herein incorporated by reference.

BACKGROUND

1. Field of the Invention

The embodiments herein generally relate to field effect transistors and, more particularly, to a field effect transistor with decreased drive current temperature-sensitivity.

2. Description of the Related Art

Carrier mobility in field effect transistors can be temperature-sensitive. For example, the mobility of electrons in n-type field effect transistor (n-FET) channel regions has been observed to be inversely proportional to temperature. Similarly, changes in the mobility of holes in p-type field effect transistor (p-FET) channel regions have also been observed to be inversely proportional to temperature. Since carrier mobility directly affects drive current, temperature sensitivity puts a greater demand on circuit design. Particularly, temperature sensitivity puts a greater demand on analog circuit design because analog circuits generally require very tight tolerances. Therefore, there is a need in the art of a field effect transistor that is configured such that drive current temperature sensitivity is minimized or eliminated.

SUMMARY

In view of the foregoing, disclosed herein are embodiments of a field effect transistor (FET) having decreased drive current temperature sensitivity. Specifically, the FET is configured so that any temperature-dependent charge carrier mobility change in the channel region is simultaneously counteracted by an opposite strain-dependent charge carrier mobility change to ensure that drive current remains approximately constant or at least within a predetermined range in response to temperature variations. This opposite strain-dependent carrier mobility change is provided by at least one straining structure configured to impart a temperature-dependent amount of a pre-selected strain type on the channel region. Also disclosed are embodiments of an associated method of forming the field effect transistor.

Specifically, disclosed herein are embodiments of a field effect transistor (FET) that comprises one or more preconfigured straining structures for imparting a temperature-dependent strain on the FET channel region. This temperature-dependent strain is tailored to ensure that overall carrier mobility and, thereby, drive current, remains approximately constant regardless of temperature.

Such straining structure(s) can be incorporated at various locations within the FET structure. For example, a straining structure can comprise a layer of a straining material above the channel region, a layer of a straining material below the channel region, a straining material comprising the gate electrode, source/drain regions on either side of the channel region comprising a straining material, and/or shallow trench isolation (STI) region adjacent to the source/drain regions and filled with a straining material.

In addition to structure location, there are at least four other factors which should be considered when pre-configuring the straining structure(s) to achieve a desired balance between temperature-dependent carrier mobility changes and strain dependent carrier mobility changes: (1) the temperature coefficient of expansion (TCE) of the straining material ($\beta_M$) relative to that of the channel region semiconductor material ($\beta_{Si}$); (2) the relative sign of the strain transfer from the straining material to the channel (i.e., the type of strain, compressive or tensile, imparted on the channel region); (3) the magnitude of this strain transfer in response to the temperature changes (i.e., the relative magnitude of strain imparted on the channel region in response to temperature changes) and (4) the mobility change for a given change ($M_S$) for a given channel strain (i.e., the direction and relative magnitude of carrier mobility changes in the channel region in response to strain changes).

If the ratio of strain in the channel to strain in the straining material is ($\eta$) and if the level of strain in the straining material is ($S_M$), then the stain in the channel ($S_C$) is given by $Sc=\eta \times S_M$. To achieve the inventive FET, the straining structure and material are chosen such that the change in mobility due to change in strain (with varying temperature) is very nearly equal to, but of opposite sign, than the change in intrinsic (unstrained) mobility of the channel carriers with temperature. By solving the following formula, the desired balance between temperature-dependent charge carrier mobility changes in the channel region and strain-dependent charge carrier mobility changes can be achieved:

$$d\mu_i/dT = -d \times \eta \times (\beta_M - \beta_{Si}),$$

where $d\mu_i/dT$ refers to the carrier mobility change in the channel region in response to temperature, d refers to the carrier mobility change in the channel region in response to strain change in the channel region (i.e., a mobility change per change in strain), $\eta$ refers to the transfer ratio of strain in the channel region from the straining material, $\beta_M$ refers to the thermal coefficient of expansion (TCE) of the straining material, and $\beta_{Si}$ refers to the thermal coefficient of expansion (TCE) of the semiconductor material in the channel region.

In other words, since the magnitude of the coefficient of thermal expansion of any structure depends on its composition and size, once the required coefficient of thermal expansion of the straining structure is determined by this formula, then the straining structure can be pre-configured. That is, the size, composition, location, etc. of the straining structure can be pre-determined such that this equation is substantially satisfied and the net change in mobility that results will be small.

For example, in a first embodiment the FET can comprise a nFET. The straining structure in this first embodiment can be preconfigured to have a pre-selected straining material with a compressive strain and a predetermined thermal expansion coefficient so that the amount of compressive strain imparted by the straining material on the channel region is inversely proportional to temperature variations. In a second embodiment, the FET can also comprise a nFET. However, in this second embodiment, the straining structure can be preconfigured to have a pre-selected straining material with a tensile strain and a predetermined thermal expansion coefficient such that the tensile strain imparted by the straining material on the channel region is directly proportional to temperature variations. In a third embodiment, the FET can comprise a pFET. The straining structure in this third embodiment can be preconfigured to have a pre-selected straining material with a tensile strain and a predetermined thermal expansion coefficient such that the tensile strain imparted on the channel region by the straining material is inversely proportional to temperature variations. In a fourth embodiment, the FET can also comprise a pFET. However, in this fourth embodiment, the straining structure can be pre-configured to have a pre-selected straining material with a compressive strain and a predetermined the thermal expansion coefficient such that the compressive strain imparted on the channel region by the straining material is directly proportional to the temperature.

Also disclosed are embodiments of a method of forming the transistors described above. Specifically, an n-type field effect transistor (nFET) or a p-type field effect transistor can be formed by using conventional processing techniques. As discussed above, mobility of charge carriers in the semiconductor channel region, whether electrons in a nFET or holes in a pFET, is temperature-sensitive as well as strain-sensitive.

The method embodiments can further comprise pre-configuring and forming, adjacent to the channel region of the FET, at least one straining structure comprising a straining material for imparting a temperature-dependent strain on the channel region. Such a straining structure can be formed at various locations within the FET structure relative to the channel region in order to ensure that temperature-dependent carrier mobility changes in the channel region are simultaneously counteracted by approximately equal and opposite strain-dependent carrier mobility changes in the channel region.

For example, a straining structure can be formed by forming an overlayer of straining material above the channel region and, specifically, above the basic FET structure. A straining structure can also be formed by forming an underlayer of straining material below the channel region. A straining structure can be formed by replacing the silicon in the source/drain regions with a straining material. A straining structure can be formed by forming straining material-filled shallow trench isolation regions adjacent to the source/drain regions. Finally, a straining structure can be formed by forming the FET gate electrode using the straining material.

Furthermore, in addition to the straining structure location there are at least four other factors that can be considered when pre-configuring the straining structure in order to achieve the desired balance between temperature-dependent carrier mobility changes and strain-dependent carrier mobility changes: (1) the temperature coefficient of expansion (TCE) of the straining material ($\beta_M$) relative to that of the channel region semiconductor material ($\beta_{Si}$); (2) the relative sign of the strain transfer from the straining material to the channel (i.e., the type of strain, compressive or tensile, imparted on the channel region); (3) the magnitude of this strain transfer in response to the temperature changes (i.e., the relative magnitude of strain imparted on the channel region in response to temperature changes) and (4) the mobility change for a given change ($M_S$) for a given channel strain (i.e., the direction and relative magnitude of carrier mobility changes in the channel region in response to strain changes).

If the ratio of strain in the channel to strain in the straining material is ($\eta$) and if the level of strain in the straining material is ($S_M$), then the stain in the channel ($S_C$) is given by $Sc=\eta \times S_M$. To achieve the inventive FET, the straining structure and material are chosen such that the change in mobility due to change in strain (with varying temperature) is very nearly equal to, but of opposite sign, than the change in intrinsic (unstrained) mobility of the channel carriers with temperature. By solving the following formula, the balance between temperature-dependent charge carrier mobility changes and strain-dependent charge carrier mobility changes can be achieved:

$$d\mu_c/dT = -d \times \eta \times (\beta_M - \beta_{Si}),$$

where $d\mu_c/dT$ refers to the carrier mobility change in the channel region in response to temperature, d refers to the carrier mobility change in the channel region in response to strain change in the channel region (i.e., a mobility change per change in strain), $\eta$ refers to the transfer ratio of strain in the channel region from the straining material, $\beta_M$ refers to the thermal coefficient of expansion (TCE) of the straining material, and $\beta_{Si}$ refers to the thermal coefficient of expansion (TCE) of the semiconductor material in the channel region.

In other words, since the magnitude of the coefficient of thermal expansion of any structure depends on its composition and size, once the required coefficient of thermal expansion of the straining structure is determined by this formula, then the straining structure can be pre-configured. That is, the size, composition, location, etc. of the straining structure can be pre-determined such that this equation is substantially satisfied and the net change in mobility that results will be small.

For example, in a first embodiment, the method can comprise forming a nFET. In this first embodiment, the process of pre-configuring the straining structure comprises pre-selecting a straining material having a compressive strain and pre-determining a thermal expansion coefficient for the straining material such that the amount of compressive strain imparted by the straining material on the channel region is inversely proportional to temperature variations. In a second embodiment, the method can also comprise forming a nFET. In this second embodiment, however, the process of pre-configuring the straining structure comprises pre-selecting a straining material having a tensile strain and predetermining a thermal expansion coefficient for the straining material such that the tensile strain imparted on the channel region by the straining material is directly proportional to temperature variations. In a third embodiment, the method can comprise forming a pFET. In this third embodiment, the process of pre-configuring the straining structure comprises pre-selecting a straining material having tensile strain and predetermining a thermal expansion coefficient for the straining material such that the tensile strain imparted on the channel region is inversely proportional to temperature variations. In a fourth embodiment, the method can also comprise forming a pFET. In this fourth embodiment, however, the process of pre-configuring the straining structure can comprise pre-selecting a straining material having a compressive strain and predetermining a thermal expansion coefficient for the straining material such that the compressive strain imparted on the channel region by the straining material is directly proportional to the temperature.

These and other aspects of the embodiments herein will be better appreciated and understood when considered in conjunction with the following description and the accompanying drawings. It should be understood, however, that the following descriptions, while indicating preferred embodiments herein and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned above, charge carrier mobility in channel region of field effect transistors (FETs) is temperature-sensitive and further directly impacts drive current. This puts greater demand on circuit design and, particularly, on analog circuit design because analog circuits generally require very tight tolerances.

In view of the foregoing, disclosed herein are embodiments of a field effect transistor (FET) having decreased drive current temperature sensitivity. Specifically, in each embodiment the FET incorporates at least one pre-configured straining structure so that any temperature-dependent charge carrier mobility changes in the channel region are simultaneously counteracted by approximately equal and opposite strain-dependent charge carrier mobility changes so as to ensure that drive current remains approximately constant or at least within a predetermined range in response to temperature variations. Various factors are considered, when pre-configuring the straining structure(s). For example, the straining structure transfer ratio and the temperature coefficient of expansion (TCE) of the straining layer are adjusted to largely cancel the intrinsic change in mobility with temperature of the transistor carriers. Also disclosed are embodiments of an associated method of forming the field effect transistor.

Specifically, disclosed are embodiments of a field effect transistor (FET) (see FETs 100-500 of FIGS. 1-5). Each FET 100-500 can comprise a p-type transistor (pFET) in which the charge carriers in the channel region are holes or an n-type field effect transistor (nFET) in which the charge carriers in the channel region are electrons.

Figure 7:
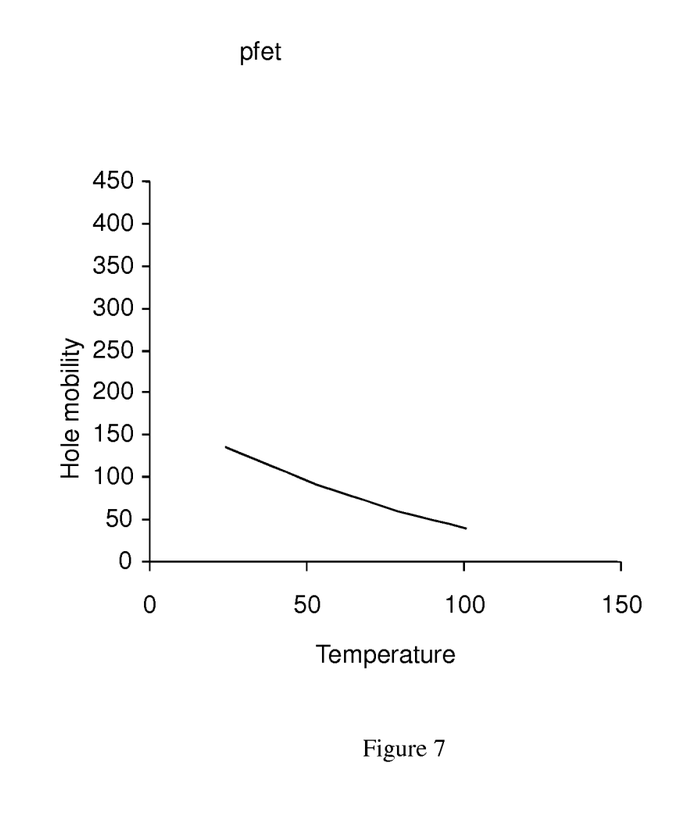
FIG. 7 is a graph illustrating an exemplary direct relationship between hole mobility and temperature in the channel region of a p-type field effect transistor (pFET)
Figure 8:
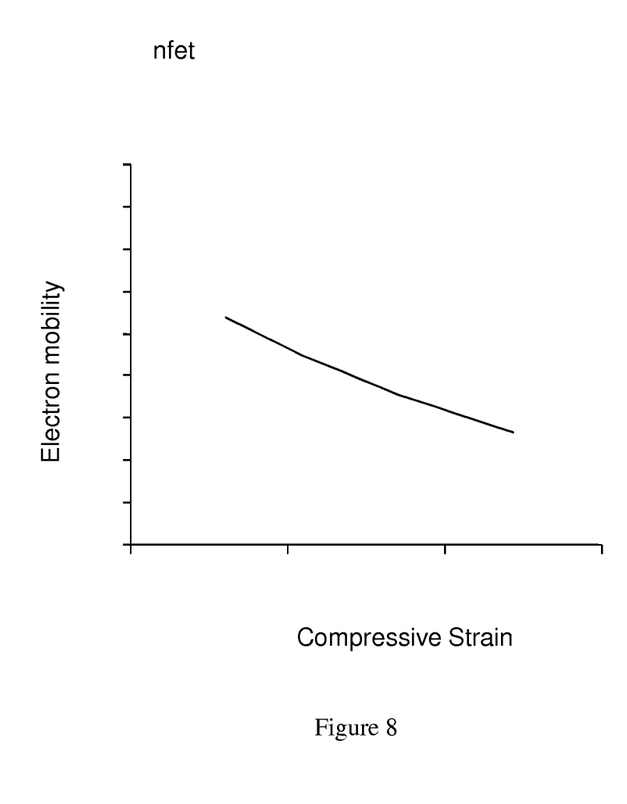
FIG. 8 is a graph illustrating an exemplary inverse relationship between electron mobility and compressive strain in the channel region of a nFET.
Figure 9:
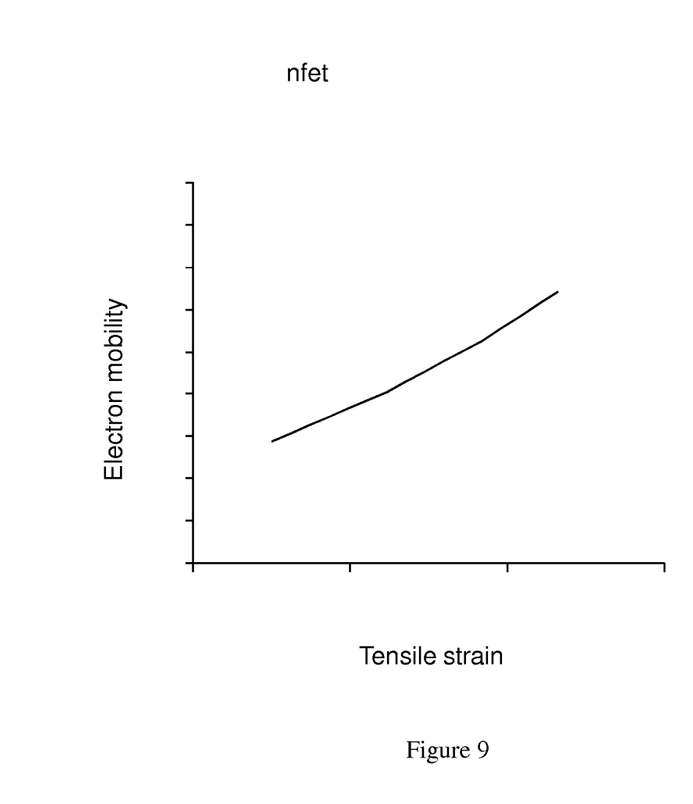
FIG. 9 is a graph illustrating an exemplary direct relationship between electron mobility and tensile strain in the channel region of a nFET.
Figure 10:
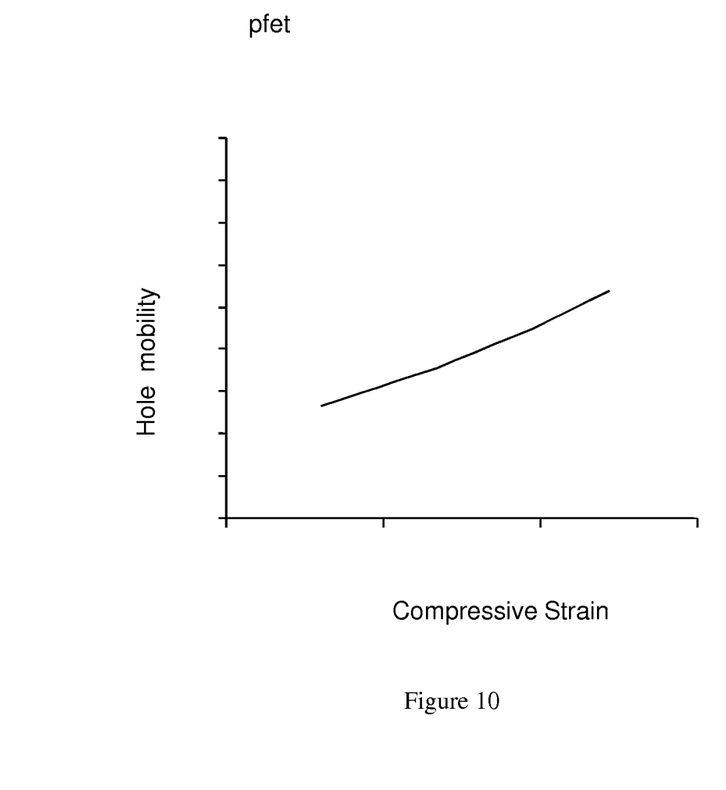
FIG. 10 is a graph illustrating an exemplary direct relationship between hole mobility and compressive strain in the channel region of a pFET.
Figure 11:
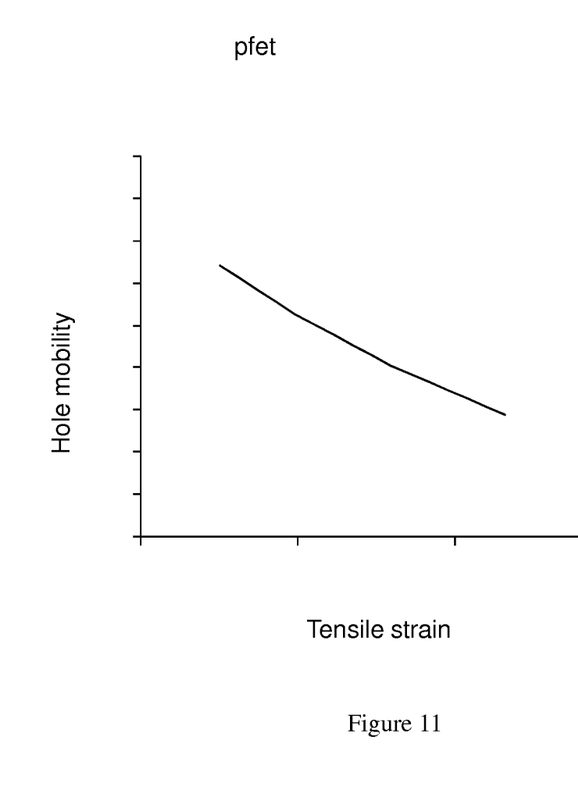
FIG. 11 is a graph illustrating an exemplary inverse relationship between hole mobility and tensile strain in the channel region of a pFET.

Mobility of charge carriers (i.e., electrons in nFETs and holes in pFETs) directly affects drive current. Furthermore, mobility of charge carriers is dependent upon the temperature in the channel region (i.e., mobility is temperature-sensitive). For example, in pFETs (e.g., with {100} channel planes and with current vector in the <110> direction), it has been observed that hole mobility changes in the channel region are inversely proportional to temperature changes (see FIG. 7). Similarly, in nFETs (e.g., with {100} channel planes) it has been observed that electron mobility changes in the channel region are inversely proportional to temperature changes. Finally, mobility of the charge carriers is also dependent upon the amount and type of strain in the channel region. For example, in pFETs it has been observed that carrier mobility changes are directly proportional to changes in the amount of uniaxial compressive strain imparted on the channel region (see FIG. 10) and inversely proportional to the amount of uniaxial tensile strain imparted on the channel region (see FIG. 11). Contrarily, in nFETs it has been observed that carrier mobility changes are directly proportional to the amount of uniaxial tensile strain imparted on the channel region (see FIG. 9) and inversely proportional to the amount of uniaxial tensile strain imparted on the channel region (See FIG. 8).

Thus, the FET embodiments 100-500 herein comprise one or more pre-configured straining structures 150-550 for imparting a temperature-dependent strain on the FET channel region. This temperature-dependent strain is tailored to ensure that overall carrier mobility and, thereby, drive current, remains approximately constant regardless of temperature.

Figure 1:
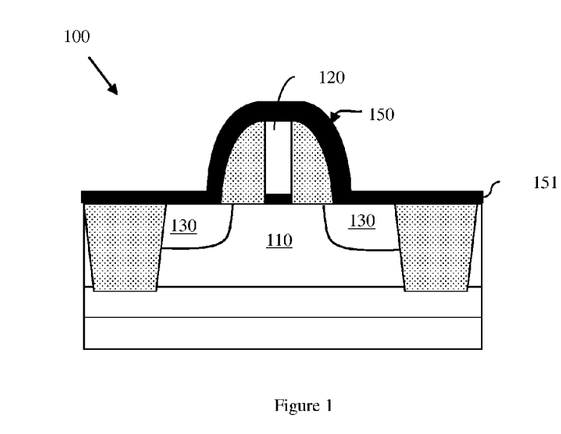
FIG. 1 is a schematic diagram illustrating a FET with an overlayer straining structure.
Figure 2:
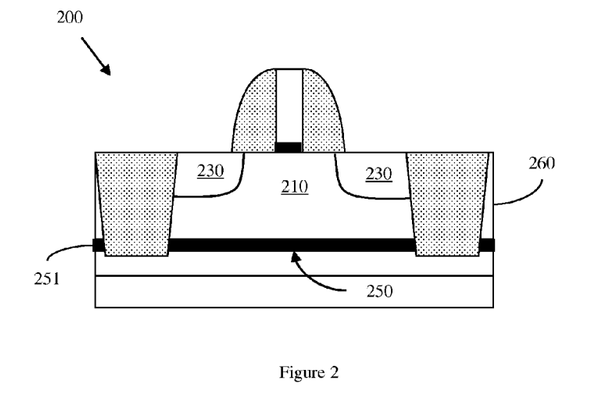
FIG. 2 is a schematic diagram illustrating a FET with an underlayer straining structure.
Figure 3:
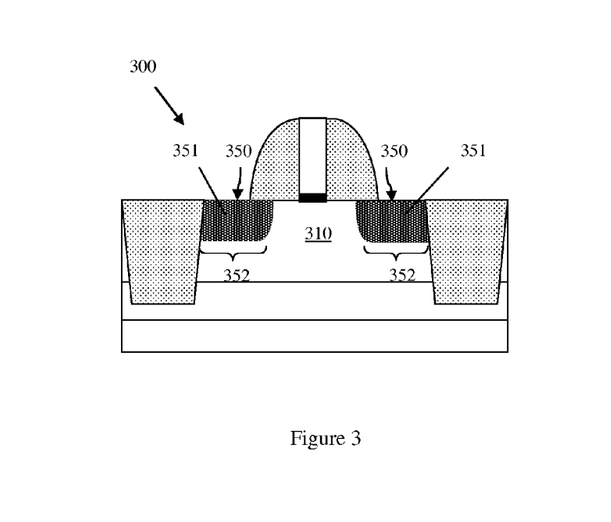
FIG. 3 is a schematic diagram illustrating a FET with source/drain straining structures.
Figure 4:
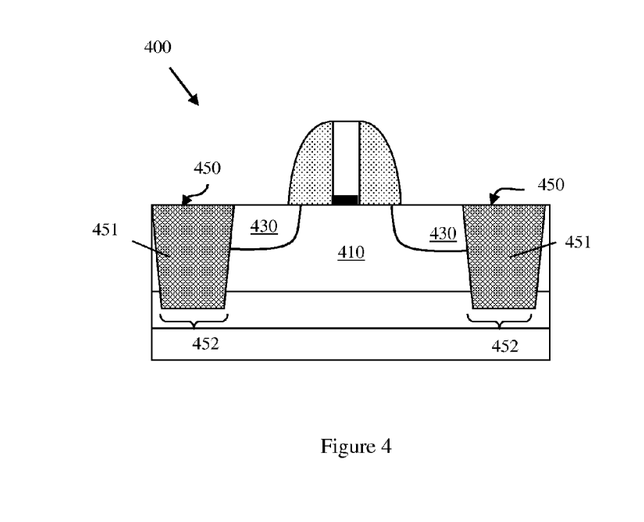
FIG. 4 is a schematic diagram illustrating a FET with trench isolation straining structures.
Figure 5:
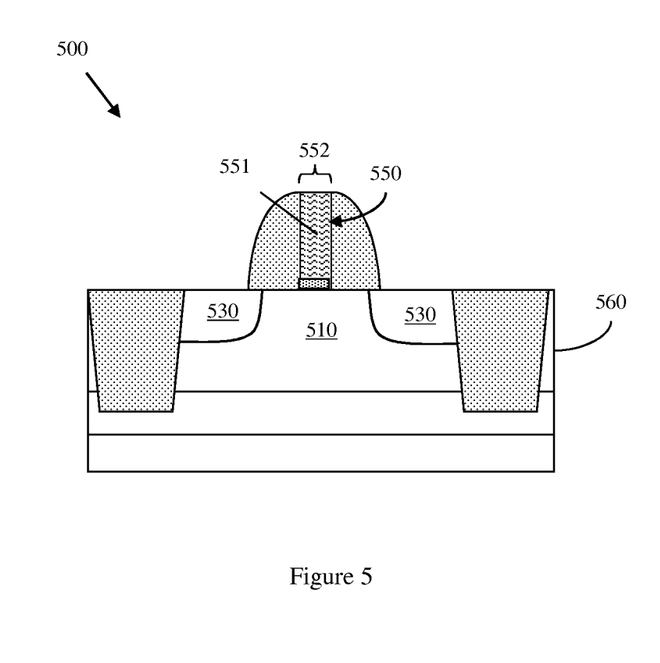
FIG. 5 is a schematic diagram illustrating a FET with gate electrode straining structure.
Figure 6:
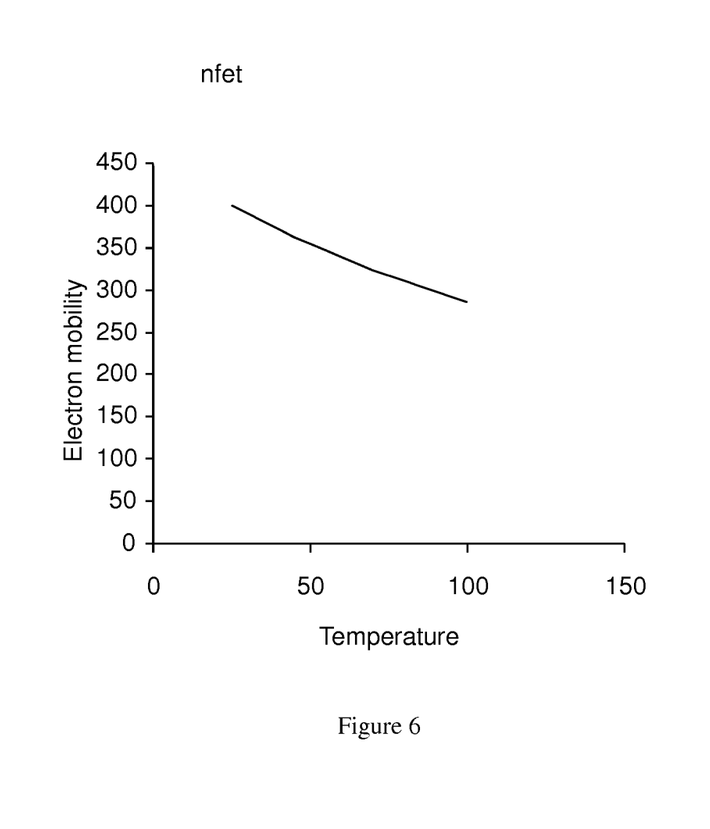
FIG. 6 is a graph illustrating an exemplary inverse relationship between electron mobility and temperature in the channel region of an n-type field effect transistor (nFET)

The location of the straining structure(s) relative the channel region may vary so long as the straining structures can exert a physical straining force (e.g., a compressive or tensile strain) on the channel region. For example, as illustrated in FIG. 1, a straining structure 150 can comprise a layer 151 of the straining material above the channel region 110 (i.e., an overlayer), gate 120 and source/drain regions 130 of the FET 100. As illustrated in FIG. 2, a straining structure 250 can comprise a layer 251 of the straining material below the channel region 210 (i.e., an underlayer) of the FET 200. As illustrated in FIG. 3, a straining structure 350 can comprise source/drain regions 352 on either side of the channel region 310 of the FET 300, where the source/drain regions 352 comprise the straining material 351 (e.g., epitaxially grown silicon germanium in place of silicon). As illustrated in FIG. 4, a straining structure 450 can comprise shallow trench isolation (STI) regions 452 adjacent to the source/drain regions 430 of FET 400, where the STIs 452 are filled with the straining material 451. Finally, as illustrated in FIG. 5, a straining structure 550 can comprise the gate electrode 552 formed using the straining material 551.

It should be understood that although the embodiments illustrated in FIGS. 1-5 show only a single straining structure in each transistor 100-500, any suitable combination of the illustrated straining structures 150-550 may be incorporated into the FET structure of the embodiments herein in order to achieve the desired balance between temperature-dependent charge carrier mobility changes and strain-dependent charge carrier mobility changes in response to temperature variations.

As mentioned above, carrier mobility changes are both temperature-sensitive and strain-sensitive (see FIGS. 5-10). This temperature-sensitivity and strain-sensitivity is predictable. That is, carrier mobility changes in response to variations in temperature are predictable. Additionally, the amount of strain (either tensile or compressive strain) that is imparted by a straining structure on a FET channel region in response to variations in temperature is predictable. That is, the thermal expansion coefficient of a straining material (i.e., the amount that the straining material will expand for each degree of temperature increase), the thermal expansion coefficient of the channel region, as well as other factors including, but not limited to, the mismatch between the coefficients of thermal expansion and the size and location of the straining structure relative to the channel region can all be used to predict temperature-dependent strain changes in the channel region that are due to the expansion or contraction of the straining material in response to temperature variations. Finally, the amount of carrier mobility changes in response to predicted strain changes is also predictable. That is, the predicted temperature-dependent strain changes in the channel region can, in turn, be used to predict strain-dependent mobility changes in the channel region.

Consequently, knowing the temperature-sensitivity of carrier mobility in a channel region 110-510, the configuration of a temperature-sensitive straining structure 150-550 can be tailored and physically positioned to counteract predicted temperature-sensitive mobility changes. That is, the straining material in each straining structure (see structures 150-550 of FIGS. 1-5) can be pre-selected to have a given strain type (e.g., compressive or tensile) in order to impart that given strain type of strain on the FET channel region 110-510. The straining material in the straining structure 150-550 can also be pre-configured to have a predetermined thermal expansion coefficient (TCE) so that the amount of strain imparted by the straining structure on the channel region is temperature-sensitive (i.e., so that the compressive or tensile strain varies depending upon the temperature).

More specifically, there are at least four factors that can be considered when pre-configuring this straining structure 150-550 to achieve the desired balance between temperature-dependent charge carrier mobility changes in the channel region and strain-dependent charge carrier mobility changes and, thereby, to ensure that drive current is essentially independent of temperature: (1) the temperature coefficient of expansion (TCE) of the straining material ($\beta_M$) relative to that of the channel region semiconductor material ($\beta_{Si}$); (2) the relative sign of the strain transfer from the straining material to the channel (i.e., the type of strain, compressive or tensile, imparted on the channel region); (3) the magnitude of this strain transfer in response to the temperature changes (i.e., the relative magnitude of strain imparted on the channel region in response to temperature changes) and (4) the mobility change for a given change ($M_S$) for a given channel strain (i.e., the direction and relative magnitude of carrier mobility changes in the channel region in response to strain changes).

If the ratio of strain in the channel to strain in the straining material is ($\eta$) and if the level of strain in the straining material is ($S_M$), then the stain in the channel ($S_C$) is given by Sc=$\eta \times$Sm. To achieve the inventive FET, the straining structure and material are chosen such that the change in mobility due to change in strain (with varying temperature) is very nearly equal to, but of opposite sign, the change in intrinsic (unstrained) mobility of the channel carriers with temperature. By solving the following formula, the desired balance between temperature-dependent charge carrier mobility changes in the channel region and strain-dependent charge carrier mobility changes can be achieved:

$$d\mu_T/dT = -d \times \eta \times (\beta_M - \beta_{Si}),$$

where $d\mu_T/dT$ refers to the carrier mobility change in the channel region in response to temperature, d refers to the carrier mobility change in the channel region in response to strain change in the channel region (i.e., a mobility change per change in strain), $\eta$ refers to the transfer ratio of strain in the channel region from the straining material, $\beta_M$ refers to the thermal coefficient of expansion (TCE) of the straining material, and $\beta_{Si}$ refers to the thermal coefficient of expansion (TCE) of the semiconductor material in the channel region.

In other words, since the magnitude of the coefficient of thermal expansion of any structure depends on its composition and size, once the required coefficient of thermal expansion of the straining structure is determined by this formula, then the straining structure can be pre-configured. That is, the size, composition, location, etc. of the straining structure can be pre-determined such that this equation is substantially satisfied and the net change in mobility that results will be small.

In an exemplary case, a nFET can be configured with a straining overlayer above the FET, and the overlayer material can be pre-selected so that the thermal expansion coefficient of the overlayer material is less than that of the transistor semiconductor material (e.g., less than that of silicon). The strain transfer of such systems is typically $\approx$ ~0.1 (positive) so that as temperature increases, the strain in the channel region of the nFET decreases in absolute value (i.e., tends towards increased tension). This factor tends to cause an increase in electron mobility with increasing temperature and counteracts the intrinsic decrease in electron mobility that would otherwise result. Adjustment of the transfer efficiency can be effected through spacing of the overlayer to the transistor channel, thickness of the overlayer material, recess of the source and drain junctions below the channel surface, as well as other factors. The temperature coefficient of the overlayer material can be altered by details of deposition process such as temperature, pressure, rate, and chemical reactants. Note that the pre-existing strain in the overlayer material can be compressive (>0), tensile (<0) or neutral (=0), as long as the relative TCE of the overlayer material is less than that of the transistor semiconductor material. This same analysis can be applied to design various structural embodiments.

For example, referring to FIGS. 1 and 2, the straining structure 150, 250 may comprise a nitride layer 151, 251 with a predetermined thickness. This nitride layer 151, 251 can be positioned either above (see structure 150 of FET 100 in FIG. 1) or below (see structure 250 of FET 200 in FIG. 2) the channel region 110, 210 and can be either compressive or tensile, depending upon the deposition conditions and bond ratio of nitrogen with other elements of the straining material (e.g., silicon, hydrogen, etc.). Alternatively, referring to FET 400 in FIG. 4, the straining structure 450 may comprise an oxide-filled shallow trench isolation (STI) structure 451 adjacent to the FET source/drain regions 430 and having a predetermined volume. This oxide-fill material 451 can be either compressive (e.g., a high density plasma (HDP) oxide) or tensile (e.g., a tetraethooxysihme (TEOS) oxide). Referring to FET 300 in FIG. 3, the straining structure 350 might also comprise a predetermined volume of compressive silicon germanium 351 in place of silicon in the FET source/drain regions 352. Finally, referring to FET 500 in FIG. 5, the straining structure 550 might also comprise a gate electrode 552 directly above the channel region 510 comprising a pre-determined volume of a compressive or tensile conductor 551.

Figure 12:
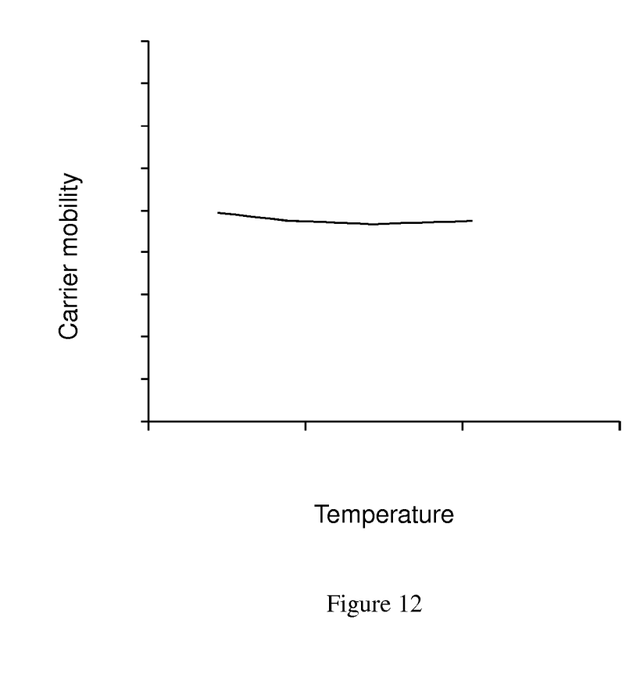
FIG. 12 is a graph illustrating independence of carrier mobility on temperature in the FET embodiments herein.

Again, each of these features 150-550 described above is pre-configured with a certain strain type, thermal expansion coefficient and location relative to the channel region so that in response to temperature change the desired increase or decrease in compressive or tensile strain is achieved. For example, in a first embodiment the FET 100-500 can comprise a nFET, the pre-selected strain of the straining material 151, 251, 351, 451, 551 in the straining structure 150, 250, 350, 450, 550, respectively, can comprise a compressive strain and the thermal expansion coefficient can be predetermined such that the amount of compressive strain imparted by the straining material on the channel region can be inversely proportional to temperature variations. More specifically, as mentioned above, electron mobility is inversely proportional to temperature variations (see FIG. 6). Thus, as temperature increases, electron mobility decreases and as temperature decreases, electron mobility increases. Additionally, also as mentioned above, for a nFET electron mobility inversely proportional to compressive strain (see FIG. 8). That is, for a nFET as compressive strain increases in the channel region, electron mobility decreases and as compressive strain decreases in the channel region electron mobility increases. Consequently, an increase in temperature will result in a temperature-dependent decrease in electron mobility in the nFET channel region, but will also simultaneously result in a temperature-dependent decrease in the compressive strain on the channel region. This temperature-dependent decrease in the compressive strain will in turn result in a strain-dependent increase in electron mobility in the channel region. Contrarily, a decrease in temperature will result in a temperature-dependent increase in electron mobility in the nFET channel region, but will also simultaneously result in a temperature-dependent increase in the compressive strain on the channel region. This temperature-dependent increase in the compressive strain will in turn result in a strain-dependent decrease in electron mobility in the channel region. Thus, net charge carrier mobility remains approximately unchanged (as illustrated in FIG. 12) or at least with a predetermined range.

In second embodiment, the FET 100-500 can also comprise a nFET, the pre-selected strain of the straining structure 150-550 can comprise a tensile strain, and the thermal expansion coefficient can be predetermined such that the tensile strain on the channel region is directly proportional to temperature variations. More specifically, as mentioned above, electron mobility is inversely proportional to temperature variations (see FIG. 6). Thus, as temperature increases, electron mobility decreases and as temperature decreases, electron mobility increases. Additionally, also as mentioned above, for a nFET electron mobility is directly proportional to tensile strain. That is, as tensile strain increases in the channel region, electron mobility increases and as tensile strain decreases in the channel region electron mobility decreases (see FIG. 9). Consequently, an increase in temperature will result in a temperature-dependent decrease in electron mobility in the nFET channel region, but will also simultaneously result in a temperature-dependent increase in the tensile strain on the channel region. This temperature-dependent increase in the tensile strain will in turn result in a strain-dependent increase in electron mobility in the channel region. Contrarily, a decrease in temperature will result in a temperature-dependent increase in electron mobility in the nFET channel region, but will also simultaneously result in a temperature-dependent decrease in the tensile strain on the channel region. This temperature-dependent decrease in the tensile strain will in turn result in a strain-dependent decrease in electron mobility in the channel region. Thus, net mobility remains approximately unchanged (as illustrated in FIG. 12) or at least with a predetermined range.

In third embodiment, the FET 100-500 can comprise a pFET, the pre-selected strain can of the straining structure 150-550 comprise a tensile strain, and the thermal expansion coefficient can be predetermined such that the tensile strain on the channel region is inversely proportional to the temperature (i.e., such that the TCE of the overlayer is less than that of silicon for a positive strain transfer coefficient, or greater than that of silicon for a negative strain transfer coefficient). More specifically, as mentioned above, hole mobility is inversely proportional to temperature variations (see FIG. 7). Thus, as temperature increases, intrinsic hole mobility decreases and as temperature decreases, intrinsic hole mobility increases. Additionally, also as mentioned above, for a pFET hole mobility is inversely proportional to tensile strain. That is, as tensile strain decreases in the channel region, hole mobility increases and as tensile strain increases in the channel region hole mobility decreases (see FIG. 11). Consequently, an increase in temperature will result in a temperature-dependent decrease in hole mobility in the pFET channel region, but will also simultaneously result in a temperature-dependent decrease in the tensile strain on the channel region. This temperature-dependent decrease in the tensile strain will in turn result in a strain-dependent increase in hole mobility in the channel region. Contrarily, a decrease in temperature will result in a temperature-dependent increase in hole mobility in the pFET channel region, but will also simultaneously result in a temperature-dependent increase in the tensile strain on the channel region. This temperature-dependent increase in the tensile strain will in turn result in a strain-dependent decrease in hole mobility in the channel region. Thus, net mobility remains approximately unchanged (as illustrated in FIG. 12) or at least with a predetermined range.

In a fourth embodiment, the FET 100-500 can also comprise a pFET, the pre-selected strain of the straining structure 150-550 can comprise a compressive strain, and the thermal expansion coefficient can be predetermined such that the compressive strain on the channel region is directly proportional to temperature variations. More specifically, as mentioned above, (unstrained) hole mobility is inversely proportional to temperature variations (see FIG. 7). Thus, as temperature increases, hole mobility decreases and as temperature decreases, hole mobility increases. Additionally, also as mentioned above, for a pFET hole mobility is directly proportional to compressive strain. That is, as compressive strain increases in the channel region, hole mobility increases and as compressive strain decreases in the channel region hole mobility decreases (see FIG. 10). Consequently, an increase in temperature will result in a temperature-dependent decrease in intrinsic hole mobility in the pFET channel region, but will also simultaneously result in a temperature-dependent increase in the compressive strain on the channel region. This temperature-dependent increase in the compressive strain will in turn result in a strain-dependent increase in hole mobility in the channel region. Contrarily, a decrease in temperature will result in a temperature-dependent increase in hole mobility in the pFET channel region, but will also simultaneously result in a temperature-dependent decrease in the compressive strain on the channel region. This temperature-dependent decrease in the compressive strain will in turn result in a strain-dependent decrease in hole mobility in the channel region. Thus, net mobility remains approximately unchanged (as illustrated in FIG. 12) or at least with a predetermined range.

Figure 13:
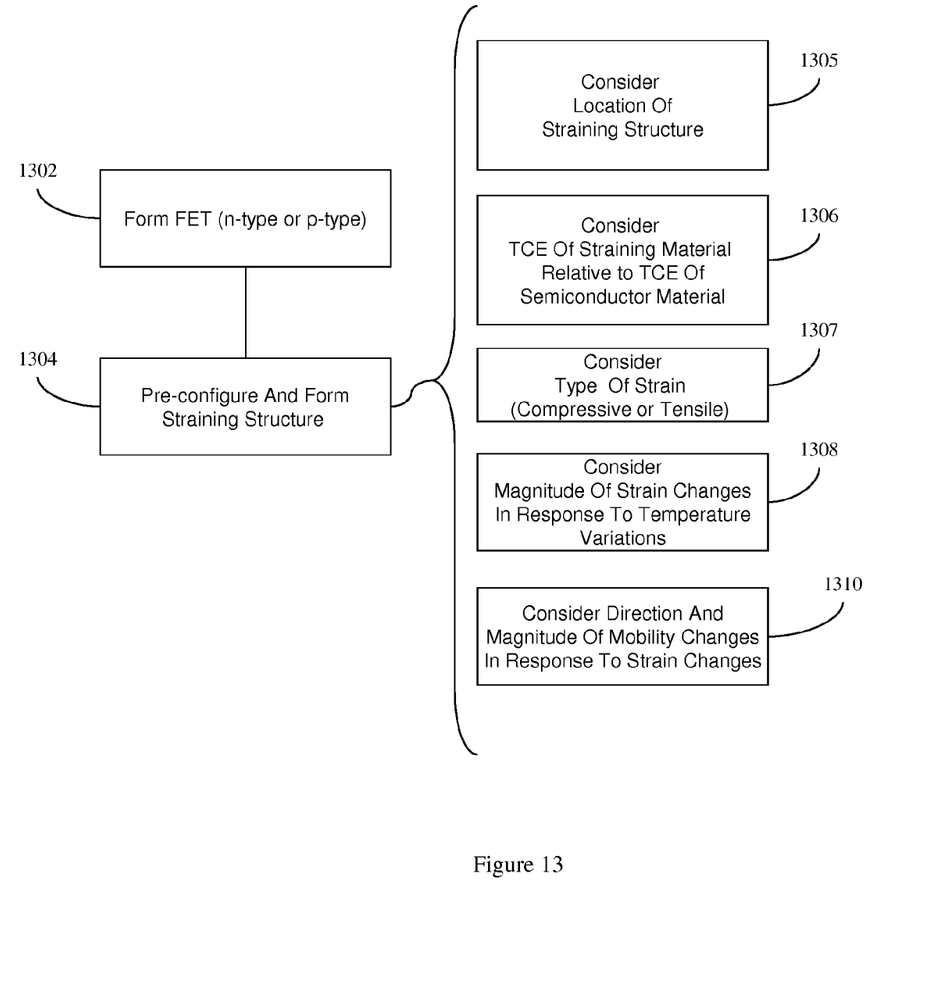
FIG. 13 is a schematic diagram illustrating embodiments of the method of the embodiments herein.

Referring to FIG. 13, also disclosed are embodiments of a method of forming the transistors described above. In the method embodiments an n-type field effect transistor (nFET) or p-type field effect transistor (pFET) is formed (1302). Specifically, a nFET can be formed using conventional processing techniques. For example, a wafer (e.g., a silicon-on-insulator (SOI) wafer) is provided and a channel region is formed in the semiconductor layer of the wafer between n-doped source/drain regions. A gate electrode is formed (e.g. patterned and etch) above the channel region. The charge carriers in the channel region of such a nFET are electrons. Alternatively, a p-type field effect transistor (pFET) can be formed using conventional processing techniques. For example, a wafer (e.g., an SOI wafer) is provided and a channel region is formed in the semiconductor layer of the wafer between p-doped source/drain regions. A gate electrode is formed (e.g., patterned and etched) above the channel region. The charge carriers in the channel region of such a pFET are holes. As discussed above, mobility of these charge carriers in the channel region, whether electrons in a nFET or holes in a pFET, is temperature-sensitive as well as strain-sensitive.

The method embodiments can further comprise pre-configuring and forming one or more straining structures adjacent to the channel region (1304) for imparting a physical straining force on the channel region. The straining structure(s) can be formed at various stages during the FET formation process 1302 and in various locations relative to the channel region of the FET in order to ensure that temperature-dependent carrier mobility changes in the channel region are simultaneously counteracted by approximately equal and opposite strain-dependent carrier mobility changes in the channel region (1305).

For example, referring to FIG. 1, during the FET 100 formation process 1302, a straining structure can be formed by using conventional processing techniques to form (e.g., deposit) an overlayer 150 of straining material above the channel region 110 and other FET components (e.g., over the gate electrode 120, gate sidewall spacers, source/drain region 130, etc.). This overlayer 150 can, for example, comprise a deposited nitride layer that is either compressive or tensile, depending upon the deposition conditions and bond ratio of nitrogen with other elements of the straining material (e.g., silicon, hydrogen, etc.). Referring to FIG. 2, a straining structure can also be formed prior to the FET formation processes 1302, by providing a wafer having a preformed underlayer 250 (e.g., a nitride underlayer) of straining material below the semiconductor layer 260 in which the channel region 210 and source/drain regions are formed. Referring to FIG. 3, a straining structure can also be formed by selectively etching away silicon in the source/drain regions of the FET and replacing that silicon with a straining material (e.g., by epitaxially growing silicon germanium 350 in the source/drain regions on the sides of the channel region 310). Referring to FIG. 4, a straining structure can be formed by forming straining material-filled shallow trench isolation (STI) regions 450 adjacent to the FET source/drain regions 430. This STI fill material can be either compressive (e.g., a high density plasma (HDP) oxide) or tensile (e.g., a tetraethooxysihme (TEOS) oxide). Finally, referring to FIG. 5, a straining structure can be formed by forming a gate electrode 550 (e.g., by convention deposition an patterning processes) with a conductive straining material.

It should be understood that although the method embodiments discussed herein and illustrated in FIGS. 1-5 refer to the formation a single straining structure in each transistor 100-500, any suitable combination of multiple straining structures can be formed and incorporated into the FET structure in order to achieve the desired balance between temperature-dependent charge carrier mobility changes and strain-dependent charge carrier mobility changes in response to temperature variations.

Furthermore, in addition to the straining structure location there are at least four other factors that can be considered when pre-configuring the straining structure to achieve the desired balance between temperature-dependent carrier mobility changes and strain-dependent carrier mobility changes (1306-1310): (1) the temperature coefficient of expansion (TCE) of the straining material ($\beta_M$) relative to that of the channel region semiconductor material ($\beta_{Si}$); (2) the relative sign of the strain transfer from the straining material to the channel (i.e., the type of strain, compressive or tensile, imparted on the channel region); (3) the magnitude of this strain transfer in response to the temperature changes (i.e., the relative magnitude of strain imparted on the channel region in response to temperature changes) and (4) the mobility change for a given change ($M_S$) for a given channel strain (i.e., the direction and relative magnitude of carrier mobility changes in the channel region in response to strain changes).

If the ratio of strain in the channel to strain in the straining material is ($\eta$) and if the level of strain in the straining material is ($S_M$), then the stain in the channel ($S_C$) is given by Sc=$\eta \times S_M$. By solving the following formula, the desired balance between temperature-dependent charge carrier mobility changes in the channel region and strain-dependent charge carrier mobility changes can be achieved:

$$d\mu_r/dT = -d \times \eta \times (\beta_M - \beta_{Si}),$$

where $d\mu_r/dT$ refers to the carrier mobility change in the channel region in response to temperature, d refers to the carrier mobility change in the channel region in response to strain change in the channel region (i.e., a mobility change per change in strain), $\eta$ refers to the transfer ratio of strain in the channel region from the straining material, $\beta_M$ refers to the thermal coefficient of expansion (TCE) of the straining material, and $\beta_{Si}$ refers to the thermal coefficient of expansion (TCE) of the semiconductor material in the channel region.

In other words, since the magnitude of the coefficient of thermal expansion of any structure depends on its composition and size, once the required coefficient of thermal expansion of the straining structure is determined by this formula, then the straining structure can be pre-configured. That is, the size, composition, location, etc. of the straining structure can be pre-determined such that this equation is substantially satisfied and the net change in mobility that results will be small.

For example, in a first embodiment, the method can comprise forming a nFET at process 1302. In this embodiment the process 1304 of pre-configuring the straining structure can comprise pre-selecting a straining material having a compressive strain and predetermining the thermal expansion coefficient of that straining material such that the amount of compressive strain imparted by the straining material on the channel region is inversely proportional to temperature variations. More specifically, as mentioned above, electron mobility is inversely proportional to temperature variations (See FIG. 6). Thus, as temperature increases, electron mobility decreases and as temperature decreases, electron mobility increases. Additionally, also as mentioned above, for a nFET electron mobility is inversely proportional to compressive strain (see FIG. 8). That is, as compressive strain increases in the channel region, electron mobility decreases and as compressive strain decreases in the channel region electron mobility increases. Consequently, an increase in temperature will result in a temperature-dependent decrease in electron mobility in the nFET channel region, but will also simultaneously result in a temperature-dependent decrease in the compressive strain on the channel region. This temperature-dependent decrease in the compressive strain will in turn result in a strain-dependent increase in electron mobility in the channel region. Contrarily, a decrease in temperature will result in a temperature-dependent increase in electron mobility in the nFET channel region, but will also simultaneously result in a temperature-dependent increase in the compressive strain on the channel region. This temperature-dependent increase in the compressive strain will in turn result in a strain-dependent decrease in electron mobility in the channel region.

In a second embodiment, the method can also comprise forming a nFET at process 1202. In this embodiment the process 1304 of pre-configuring the straining structure can comprise pre-selecting a straining material having a tensile strain and predetermining the thermal expansion coefficient of that straining material such that the tensile strain on the channel region is directly proportional to temperature variations. More specifically, as mentioned above, electron mobility is inversely proportional to temperature variations (See FIG. 6). Thus, as temperature increases, electron mobility decreases and as temperature decreases, electron mobility increases. Additionally, also as mentioned above, for a nFET electron mobility is directly proportional to tensile strain (see FIG. 9). That is, as tensile strain increases in the channel region, electron mobility increases and as tensile strain decreases in the channel region electron mobility decreases. Consequently, an increase in temperature will result in a temperature-dependent decrease in electron mobility in the nFET channel region, but will also simultaneously result in a temperature-dependent increase in the tensile strain on the channel region. This temperature-dependent increase in the tensile strain will in turn result in a strain-dependent increase in electron mobility in the channel region. Contrarily, a decrease in temperature will result in a temperature-dependent increase in electron mobility in the nFET channel region, but will also simultaneously result in a temperature-dependent decrease in the tensile strain on the channel region. This temperature-dependent decrease in the tensile strain will in turn result in a strain-dependent decrease in electron mobility in the channel region.

In a third embodiment, the method can comprise forming a pFET at process 1202. In this embodiment, the process 1304 of pre-configuring the straining structure can comprise pre-selecting a straining material having a tensile strain material and predetermining the thermal expansion coefficient of that straining material such that the tensile strain imparted on the channel region is inversely proportional to temperature variations. More specifically, as mentioned above, hole mobility is inversely proportional to temperature variations (see FIG. 7). Thus, as temperature increases, hole mobility decreases and as temperature decreases, hole mobility increases. Additionally, also as mentioned above, for a pFET hole mobility is inversely proportional to tensile strain (see FIG. 11). That is, as tensile strain increases in the channel region, hole mobility decreases and as tensile strain decreases in the channel region hole mobility increases. Consequently, an increase in temperature will result in a temperature-dependent decrease in hole mobility in the pFET channel region, but will also simultaneously result in a temperature-dependent decrease in the tensile strain on the channel region. This temperature-dependent decrease in the tensile strain will in turn result in a strain-dependent increase in hole mobility in the channel region. Contrarily, a decrease in temperature will result in a temperature-dependent increase in hole mobility in the pFET channel region, but will also simultaneously result in a temperature-dependent increase in the tensile strain on the channel region. This temperature-dependent increase in the tensile strain will in turn result in a strain-dependent decrease in hole mobility in the channel region.

In a fourth embodiment, the method can also comprise forming a pFET at process 1302. In this embodiment, the process 1304 of pre-configuring the straining structure can comprise pre-selecting a straining material having a compressive strain and predetermining the thermal expansion coefficient of the straining material such that the compressive strain imparted on the channel region is directly proportional to the temperature variations. More specifically, as mentioned above, hole mobility is inversely proportional to temperature variations (see FIG. 7). Thus, as temperature increases, hole mobility decreases and as temperature decreases, hole mobility increases. Additionally, also as mentioned above, for a pFET hole mobility is directly proportional to compressive strain (see FIG. 10). That is, as compressive strain increases in the channel region, hole mobility increases and as compressive strain decreases in the channel region hole mobility decreases. Consequently, an increase in temperature will result in a temperature-dependent decrease in hole mobility in the pFET channel region, but will also simultaneously result in a temperature-dependent increase in the compressive strain on the channel region. This temperature-dependent increase in the compressive strain will in turn result in a strain-dependent increase in hole mobility in the channel region. Contrarily, a decrease in temperature will result in a temperature-dependent increase in hole mobility in the pFET channel region, but will also simultaneously result in a temperature-dependent decrease in the compressive strain on the channel region. This temperature-dependent decrease in the compressive strain will in turn result in a strain-dependent decrease in hole mobility in the channel region.

Therefore, disclosed above are embodiments of a field effect transistor (FET) having decreased drive current temperature sensitivity. Specifically, any temperature-dependent carrier mobility changes in the FET channel region are simultaneously counteracted by opposite strain-dependent carrier mobility changes to ensure that drive current remains approximately constant or at least within a predetermined range in response to temperature variations. The opposite strain-dependent carrier mobility changes are provided by a straining structure that is pre-configured to impart a temperature-dependent amount of a pre-selected strain type on the channel region. Also disclosed are embodiments of an associated method of forming the field effect transistor.

Benefits which flow from the embodiments herein include, but are not limited to, transistors capable of performing to wider operating ranges in voltage and temperature, due to smaller variation in characteristics. Furthermore, simpler analog circuits with fewer requirements for compensation are enabled, reducing cost and improving circuit performance. A wider manufacturing tolerance also can result, with reduced manufacturing costs and improved process yield.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments herein can be practiced with modification within the spirit and scope of the appended claims.

What is claimed is:

1. A method of forming a field effect transistor comprising:
    forming a channel region positioned laterally between source/drain regions and having a plurality of charge carriers; and
    forming, adjacent to said channel region, a structure comprising a straining material for imparting a strain on said channel region,
    said forming of said structure comprising pre-configuring said structure such that said strain imparted by said structure on said channel region is a temperature-dependent strain ensuring that any temperature-dependent charge carrier mobility changes in said channel region are simultaneously counteracted by approximately equal and opposite strain-dependent charge carrier mobility changes in said channel region such that a net mobility of said charge carriers remains approximately unchanged.

2. The method of claim 1, said pre-configuring comprising predetermining a thermal expansion coefficient for said straining material by solving the following formula:

$$d\mu_i/dT = -d \times \eta \times (\beta_M - \beta_{Si}),$$

where $d\mu_i/dT$ refers to a first carrier mobility change in said channel region in response to temperature, d refers to a second carrier mobility change in said channel region in response to a strain change in said channel region, $\eta$ refers to a transfer ratio of strain in said channel region from said straining material, $\beta_M$ refers to a first thermal coefficient of expansion of said straining material, and $\beta_{Si}$ refers to a second thermal coefficient of expansion of a semiconductor material comprising said channel region.

3. The method of claim 1, said forming of said structure comprising forming at least one of:
    a layer of said straining material above said channel region;
    a layer of said straining material below said channel region;
    a gate electrode comprising said straining material above said channel region;
    trench isolation regions adjacent to source/drain regions, wherein said source/drain regions are adjacent to sides of said channel region and wherein said trench isolation regions are filled with said straining material; and
    said source/drain regions, such that said source/drain regions comprise said straining material on said sides of said channel region.

4. The method of claim 1, said field effect transistor comprising an n-type field effect transistor and said pre-configuring comprising one of:
    pre-selecting a compressive strain and predetermining a thermal expansion coefficient for said straining material such that said compressive strain imparted on said channel region is inversely proportional to temperature changes; and
    pre-selecting a tensile strain and predetermining a thermal expansion coefficient for said straining material such that said tensile strain imparted on said channel region is directly proportional to temperature changes.

5. The method of claim 1, said field effect transistor comprising a p-type field effect transistor, and wherein said pre-configuring comprising one of:
    pre-selecting a tensile strain and predetermining a thermal expansion coefficient for said straining material such that said tensile strain imparted on said channel region is inversely proportional to temperature changes; and
    pre-selecting a compressive strain and predetermining a thermal expansion coefficient for said straining material such that said compressive strain imparted on said channel region is directly proportional to temperature changes.

6. A method of forming a field effect transistor comprising:
    forming a channel region positioned laterally between source/drain regions, comprising a semiconductor material and having a plurality of charge carriers; and
    forming a structure comprising a straining material positioned laterally adjacent to said channel region such that said straining material imparts a temperature-dependent strain on said channel region,
    said forming of said structure comprising pre-configuring said structure based on at least a first temperature coefficient of expansion (TCE) of said straining material relative to a second temperature coefficient of expansion (TCE) of said semiconductor material, a type of said strain imparted on said channel region, a relative magnitude of said strain imparted on said channel region in response to temperature changes, and a direction and relative magnitude of charge carrier mobility changes in said channel region in response to strain changes, such that said temperature-dependent strain ensures that any temperature-induced charge carrier mobility changes in said channel region are simultaneously counteracted by approximately equal and opposite strain-dependent carrier mobility changes in said channel region such that a net mobility of said charge carriers remains approximately unchanged.

7. The method of claim 6, said pre-configuring comprising predetermining a thermal expansion coefficient for said straining material by solving the following formula:

$$d\mu_i/dT = -d \times \eta \times (\beta_M - \beta_{Si}),$$

where $d\mu_i/dT$ refers to a first carrier mobility change in said channel region in response to temperature, d refers to a second carrier mobility change in said channel region in response to a strain change in said channel region, $\eta$ refers to a transfer ratio of strain in said channel region from said straining material, $\beta_M$ refers to a first thermal coefficient of expansion of said straining material, and $\beta_{Si}$ refers to a second thermal coefficient of expansion of a semiconductor material comprising said channel region.

8. The method of claim 6, said forming of said structure comprising forming at least one of:
    a layer of said straining material above said channel region;
    a layer of said straining material below said channel region;
    a gate electrode comprising said straining material above said channel region;
    trench isolation regions adjacent to source/drain regions, wherein said source/drain regions are adjacent to sides of said channel region and wherein said trench isolation regions are filled with said straining material; and
    said source/drain regions such that said source/drain regions comprise said straining material on said sides of said channel region.

9. The method of claim 6, said field effect transistor comprising an n-type field effect transistor and said pre-configuring comprising one of:
- pre-selecting a compressive strain and predetermining a thermal expansion coefficient for said straining material such that said compressive strain imparted on said channel region is inversely proportional to temperature changes; and
- pre-selecting a tensile strain and predetermining a thermal expansion coefficient for said straining material such that said tensile strain imparted on said channel region is directly proportional to temperature changes.

10. The method of claim 6, said field effect transistor comprising a p-type field effect transistor, and said pre-configuring comprising one of:
- pre-selecting a tensile strain and predetermining a thermal expansion coefficient for said straining material such that said tensile strain imparted on said channel region is inversely proportional to temperature changes; and
- pre-selecting a compressive strain and predetermining a thermal expansion coefficient for said straining material such that said compressive strain imparted on said channel region is directly proportional to temperature changes.

11. A method of forming a field effect transistor comprising:
- forming a channel region positioned laterally between source/drain regions and having a plurality of charge carriers; and
- forming a structure comprising a straining material adjacent to said channel region such that said straining material imparts a temperature-dependent strain on said channel region
- said forming of said structure comprises pre-configuring said structure with a predetermined volume of said straining material such that said temperature-dependent strain ensures any temperature-induced charge carrier mobility changes in said channel region are simultaneously counteracted by approximately equal and opposite strain-dependent charge carrier mobility changes in said channel region such that a net mobility of said charge carriers remains approximately unchanged.

12. The method of claim 11, said pre-configuring comprising predetermining a thermal expansion coefficient for said straining material by solving the following formula:

$$d\mu_t/dT = -d \times \eta \times (\beta_M - \beta_{Si}),$$

where $d\mu_t/dT$ refers to a first carrier mobility change in said channel region in response to temperature, d refers to a second carrier mobility change in said channel region in response to a strain change in said channel region, η refers to a transfer ratio of strain in said channel region from said straining material, $\beta_M$ refers to a first thermal coefficient of expansion of said straining material, and $\beta_{Si}$ refers to a second thermal coefficient of expansion of a semiconductor material comprising said channel region.

13. The method of claim 11, said forming of said structure comprising forming at least one of:
- a layer of said straining material above said channel region;
- a layer of said straining material below said channel region;
- a gate electrode comprising said straining material above said channel region;
- trench isolation regions adjacent to source/drain regions, wherein said source/drain regions are adjacent to sides of said channel region and wherein said trench isolation regions are filled with said straining material; and
- said source/drain regions, such that said source/drain regions comprise said straining material on said sides of said channel region.

14. The method of claim 11, said field effect transistor comprising an n-type field effect transistor and said pre-configuring comprising one of:
- pre-selecting a compressive strain and predetermining a thermal expansion coefficient for said straining material such that said compressive strain imparted on said channel region is inversely proportional to temperature changes; and
- pre-selecting a tensile strain and predetermining a thermal expansion coefficient for said straining material such that said tensile strain imparted on said channel region is directly proportional to temperature changes.

15. The method of claim 11, said field effect transistor comprising a p-type field effect transistor, and said pre-configuring comprising one of:
- pre-selecting a tensile strain and predetermining a thermal expansion coefficient for said straining material such that said tensile strain imparted on said channel region is inversely proportional to temperature changes; and
- pre-selecting a compressive strain and predetermining a thermal expansion coefficient for said straining material such that said compressive strain imparted on said channel region is directly proportional to temperature changes.

\* \* \* \* \*